United States Patent [19]
Heath et al.

[11] Patent Number: 6,103,868
[45] Date of Patent: Aug. 15, 2000

[54] ORGANICALLY-FUNCTIONALIZED MONODISPERSE NANOCRYSTALS OF METALS

[75] Inventors: James R. Heath, Santa Monica; Daniel V. Leff, Palo Alto, both of Calif.

[73] Assignee: The Regents of the University of California, Oakland, Calif.

[21] Appl. No.: 09/091,389

[22] PCT Filed: Dec. 27, 1996

[86] PCT No.: PCT/US96/20402

§ 371 Date: Jun. 18, 1998

§ 102(e) Date: Jun. 18, 1998

[87] PCT Pub. No.: WO97/24224

PCT Pub. Date: Jul. 10, 1997

[51] Int. Cl.$^7$ .................. C08F 6/12; C08J 3/14; B32B 1/00
[52] U.S. Cl. .................. 528/482; 528/458; 528/491; 428/402; 427/212; 75/331; 75/332
[58] Field of Search .................. 428/402; 427/212; 528/482, 488, 491; 75/331, 332

[56] References Cited

U.S. PATENT DOCUMENTS

| | | |
|---|---|---|
| 4,152,303 | 5/1979 | Cohen et al. . |
| 5,585,457 | 12/1996 | Newkome et al. . |
| 5,620,584 | 4/1997 | Reetz et al. . |

OTHER PUBLICATIONS

Dagani, R. *Chem. Eng. News* 1992, Nov. 23 (Nanostructured Materials Promise to Advance Range of Technologies).
Bahnemann, D.W. *Isr. J. Chem.* 1993, 33, 115.
Bawendi, M.G.; Steigerwald, M.L.; Brus, L.E. *Annu. Rev. Phys. Chem.* 1990, 41, 477.
Bonneman, H.; Brijous, W.; Brinkmann, R.; Fretzen, R.; Joussen, T.; Koppler, R.; Korall, B.; Neiteler, P.; Richter, J. *J. Mol. Catal.* 1994, 86, 129.
Bonneman, H.; Brijoux, W.; Brinkmann, R.; Dinjs, E.; Joussen, T.; Korall, B. *Angew. Chem. Int. Ed. Engl.* 1991, 30, 1312.
Brust, M.; Find, J.; Bethell, D.; Schiffrin, D.J.; Kiely, D. *J. Chem. Soc., Chem. Commun.*, 1995, 1655.
Brust, M.; Walker, M.; Bethell, D.; Schiffrin, D.J.; Whyman, R. *J. Chem. Soc., Chem. Commun.*, 1994, 802.
Colvin, V.L.; Schlamp, M.C.; Alivisatos, A.P. *Nature* 1994, 370, 354.
Drake, J.A.G., Ed. *Chemical Technology in Printing and Imaging Systems*; The Royal Society of Chemistry; Cambridge, 1993.
Hair, M., Croucher, M.D., Eds. *Colloids and Surfaces in Reprographic Technology*; A.C.S. Symposium Series No. 200; American Chemical Society; Washington, D.C. 1982.
Hamilton, J.F.; Baetzold, R.C. *Science* 1979, 205, 1213.
Hayat, M.A., Ed. *Colloidal Gold; Principles, Methods, and Applications*, vol. 1; Academic Press, Inc.: San Diego, CA, 1989.
Heath, J.R., *Science*, 1995, 1315–1316.
Heath, J.R.; Gates, S.M.; Chess, C.A. *Appl. Phys. Lett.* 1994, 64, 3569.
Henglein, A. *Chem. Rev.* 1989, 89, 1861.
Henglein, A. *Top. Curr. Chem.* 1988, 143, 113.
Hirai, H.; Yukimichi, N.; Toshima, N. *J. Macromol. Sci.–Chem.* 1979, A13(6), 727.
Hoffman, AlJ.; Mills, G.; Yee, H.; Hoffman, M.R. *J. Phys. Chem.* 1992, 96, 5546.
Kapoor, K.; Lawless, D.; Kennepohl, P.; Meisel, D.; Serpone, N. *Langmuir* 1994, 10, 3018.
Kastner, M.A. *Physics Today* 1993, 46(1), 24.
Leff, D.V., Brandt, L., Heath, J.R., *Langmuir*, 1996, 12, 4723–4730.
Leff, D.V., Ohara, C., Heath, J.R., Gelbart, W.M., *J.Phys.Chem*, 1994, 7036–7041.
Leff, D.V.; Ohara, P.C.; Heath, J.R. Gelbart, W.H. *J. Phy. Chem.* 1995, 99, 7036.
Longenberger, L.; Mills, G. *J. Phys. Chem.* 1995, 99, 475.
Markowitz, M.A.; Chow, G.; Singh, A. *Langmuir* 1994, 10, 4095.
Meguro, K., Nakamura, Y., Hayashi, Y., Torizuka, M., Esumi, K., *Chem Soc. Japan*, 1988, 347–350.
Meguro, K.; Torizuka, M.; Esumi, K.. *Bull Chem. Soc. Jpn.* 1988, 61, 341.
Nagata, Y.; Watananabe, Y.; Fujita, S.; Dohmaru, T.; Taniguchi, S. *J. Chem. Soc., Chem. Commun.* 1992, 1621.
Ohara, P.C.; Leff, D. V., Heath, J.R., Gelbart, W.M., *Am. Phy. Sci*, 1995, 3466–3469.
Rampino, L.D.; Nord, F. F.; *J. Am. Chem. Soc.* 1941, 63, 2745.
Schmid, G. *Chem. Rev.* 1992, 92, 1709.
Bonnemann et al. *Formation of Colloidal Transition Metals in Organic Phases and Their Application in Catalysis*; VCH: Weinheim, 1991.
Shiang, J.J., Arnold, C.C., Leff, D.V., Wolters, R.H., Heath, J.R., *Chem. Physics of Fullerenes*; 1996, 461–473.
Tanford, C. *The Hydrophobic Effect: Formation of Micelles and Biological Membranes*; John Wiley & Sons, Inc.: New York, NY 1980.
Torigoe, K., Esumi, K., *Langmuir*, 1992, 8, 59–63.
Turkevich, J.; Kim, G. *Science* 1970, 169, 873.
Vergaftik, M.N.; Noiseev, I.I.; Kochubey, D.I.; Zanaraev, K.I., *J. Chem. Soc., Faraday Discuss.* 1991, 92, 13.
Wang, Y.; Herron, N. . *Phys. Chem.* 1991, 95, 525.
Yeung, S.A.; Hobson, R.; Biggs, S.; Grieser, F. *J. Chem. Soc., Chem. Commun.* 1993, 378.

*Primary Examiner*—Duc Truong
*Attorney, Agent, or Firm*—Oppenheimer Wolff & Donnelly LLP

[57] ABSTRACT

Organically functionalized metal nanoparticles are produced by mixing a metal precursor with an organic surface passivant and reacting the resulting mixture with a reducing agent to generate free metal while binding the passivant to the surface of the free metal to produce organically functionalized metal particles.

14 Claims, No Drawings

ORGANICALLY-FUNCTIONALIZED MONODISPERSE NANOCRYSTALS OF METALS

FIELD OF THE INVENTION

This invention relates to metal and metal alloy nanocrystals. In one of its more particular aspects, this invention relates to organically-functionalized monodisperse nanocrystals of metals and metal alloys and methods of preparation thereof.

BACKGROUND OF THE INVENTION

Preparations for nanoparticle metal and metal oxide hydrosols are known. The myriad methods for preparing these particles include, but are not limited to: (1) the synthesis of colloidal dispersions of various transition metals (Pt, Pd, Ir, Rh, Os, Au, Ag, Fe, Co, and the like) in aqueous media, stabilized by added polymers as protective colloids; (2) the synthesis of ultrasmall metal oxide particles by the combination of water and metal chlorides, hydroxides, or acetates, in aqueous media; (3) the synthesis of Ag nanoparticles by the reduction of Ag+ in aqueous media; (4) the formation of colloidal silver and gold in aqueous media by ultrasonic radiation; (5) the formation of colloidal gold in aqueous media by the reduction of a gold salt; and (6) the formation of colloidal platinum and palladium in aqueous media by synthetic routes analogous to those for preparing gold colloids. The fabrication of large metal cluster complexes with various stoichiometries and ligands (e.g. $M_{55}L_{12}Cl_x$, M=Rh, Ru, Pt, Au; L=$PR_3$, $AsR_3$; x=6, 20; R=Ph, t-Bu) is also known.

Nanometer-scale crystallites of various metals and non-metals have received a great deal of attention in the past decade. For such crystallites, the electronic, thermodynamic, and chemical properties depend sensitively on size, shape, and surface composition; therefore, these materials have been marked for a number of technological applications ranging from chemical catalysis, photoelectronics, film growth seeding, electronic materials, reprography, xerography, electron microscopy, and others. A major challenge to this field in general and a great barrier to actualizing such applications of these novel particles is the complete control over particle size, morphology, and surface structure. The preparation and isolation of crystallites characterized by well-defined surface compositions, narrow size distributions, and uniform shape is paramount to their success as applied materials. In addition, most of these applications require that the particles be dispersible into some solvent, polymer, or other matrix as a monodisperse (non-aggregated) colloid, and that they exhibit various chemical and thermal stabilities. Metal particles involved in these various technologies include ferromagnetic materials (e.g. $Fe_2O_3$, Co), noble metals (Pd, Pt), coinage metals (Au, Ag), alloys of these metals (e.g. $Co_xAu_y$), oxides of these metals (e.g. $Ag_2O$), and others.

To date, there are only a few reports concerning the preparation of organically-functionalized metal nanoparticles. However, the products synthesized in these reports are marred by some or all of the following characteristics: 1) the resulting materials are x-ray amorphous (non-crystalline); 2) the resulting materials have poor surface compositions; 3) the resulting materials have poor solubility in aqueous and organic media; and 4) the resulting materials have broad relative size distributions (mean diameter ±50%). For example, organically-functionalized gold nanocrystals limited to certain "average" sizes, characterized by broad size distributions, and which are not soluble in aqueous media have been disclosed.

BRIEF STATEMENT OF THE INVENTION

The nanocrystal products of the present invention avoid the previously discussed problems. The "as prepared" spherical nanoparticles are crystalline and are characterized by narrow relative size distributions (as low as ±10%). More importantly, however, is the fact that they are functionalized with well-defined organic groups covalently bound to the particle surface. These organic functional groups may be altered both chemically and with respect to percent coverage on the surface. Such chemistry is tremendously useful in the following ways: 1) the organic functional groups, coupled with the size-dependent curvature of a particle surface, yield varying solubilities as a function of particle size. This fact, along with the size-dependent interactions between particles allows the production of narrow size distributions (ideally to within ±0.3 nm) over the range of ~1.5 to 10 nm, using specially developed chemical techniques; 2) the particles may be made highly soluble in aqueous media as well as a variety of organics (alkanes, aromatics, halogenated hydrocarbons, and the like). This leads to the ability to prepare particles on or inside various substrates and matrices (gels, polymers, glasses, porous materials, and the like), 3) the effect of fractional surface coverages on similar size particles can be used to sterically control chemical approach to a surface to give increased reaction selectivity in certain catalytic processes.

The method for the preparation and isolation of crystallites according to the present invention is characterized by well-defined surface compositions, narrow size distributions, and uniform shape. Also, two- and three-dimensional close-packed ordered arrays (superlattices) of these nanocrystals have been fabricated on half-micron length scales. Catalytically active metals such as Pt, Pd, and Ag and non-catalytically active metals and alloys such as Au and $Co_xAu_y$, have been prepared.

The present invention provides techniques for the synthesis of various metallic nanocrystal materials in which the resultant particles are characterized by the following properties: (1) they are soluble and resoluble in various organic media, including organic solutions containing dissolved polymers; (2) they are stable as powders or monodisperse (non-aggregated) colloids under ambient conditions for at least several days; (3) they are stable for months when stored under low temperature conditions as powders or monodisperse (non-aggregated) colloids in solution; (4) they can exist as monodisperse entities (when prepared as organic colloids) which can be readily separated into arbitrarily narrow size distributions via various chemical and chromatographic techniques; (5) they can be prepared in at least gram quantities; (6) they may consist of a host of metallic elements prepared as either pure metal particles or alloys, synthesized from the combination of a host of specific metal-containing inorganic compounds, phase transfer catalysts, surface passivants, and reducing agents; (7) they are readily dispersed into various matrices or onto various substrates (gels, polymers, glasses, alumina, silica, and the like); (8) can be arranged into two- and three-dimensional close-packed ordered arrays to form 'superlattices' exhibiting novel electronic properties dominated by single electron phenomena. Particles that have been prepared and that meet the above criteria include Au, Ag, Pt, Pd, and Co/Au (alloy). Particle sizes range from 1–20 nm diameter.

Besides the fact that the nanocrystals of the present invention have a host of materials properties not exhibited by any other particle system, a major advancement of the technology over existing prior art is the use of covalently-bound organic ligands, which form excellent kinetic and/or thermodynamically stable monolayers on the surfaces of the nanocrystals, as a route toward stabilizing these particles in solution. This enables chemically tailored solubility, monodispersity, and size control to the final metal nanocrystal product. The ligands in general have a chemical component which interacts with the metal nanocrystal surface, and a chemical component which interacts with the surrounding solvent, polymer, matrix, etc. Both components can be modified within the limits of chemical compatibility.

The invention is not limited to simple single component metallic systems. Indeed, for some systems it is difficult to chemically stabilize a bare metal particle through the use of covalent organic ligands. However, in that case, alloys of the metal may be made in which a second metal is included. Ideally, this second metal is characterized by a lower surface energy (so it coats the surface of the particle), and is itself readily stabilized by a certain organic ligand. For example, in the Co/Au system, Co has magnetic properties which lend it to potential technological applications. However, it is difficult to find ligands which chemically stabilize a Co nanocrystal. Such ligands are readily found for the Au system, and, furthermore, Au has a lower surface energy. Thus it is possible to prepare Co/Au alloyed nanocrystals which exhibit the ferromagnetic properties of Co but are characterized by the relatively simple surface chemistry of Au.

In general, the organically functionalized metal and metal alloy nanoparticles of the present invention are prepared by providing a solution or dispersion of a metal precursor, providing a solution of an organic surface passivant, mixing the metal precursor solution or dispersion with the organic surface passivant solution, reacting the resulting mixture with a reducing agent to reduce the metal precursor to free metal while concomitantly binding the organic surface passivant to the resulting free metal surface to produce organically functionalized metal or metal alloy nanoparticles having a particle diameter of 10–200 Å.

In a preferred embodiment of the invention, an organic solution of a phase transfer agent is mixed with the metal percursor prior to mixing with the organic surface passivant.

DESCRIPTION OF PREFERRED EMBODIMENTS

An inorganic gold compound such as $HAuCl_4$ is dissolved in $H_2O$ to generate a solution containing $AuCl_4^-$ as the active metal reagent. $AuCl_4^-$ is phase transferred from $H_2O$ into an organic phase such as toluene using an excess of a phase transfer reagent or catalyst such as $N(C_8H_{17})_4Br$. A stoichiometric amount of an alkylthiol such as $C_6H_{13}SH$ dissolved in an organic solvent such as toluene is added to the organic phase. Excess reducing agent such as $NaBH_4$ is dissolved in $H_2O$, added to the organic mixture with rapid stirring, and allowed to continue to stir for several hours. The aqueous layer is removed and discarded. The organic layer is passed through submicron filter paper (no material is removed, and all color passes through the paper). The organically-functionalized metal nanocrystals are precipitated using an alcohol solution such as ethanol kept at low temperature. The filtrate is washed with this same alcohol. The particles are re-dissolved in an organic solvent such as toluene, re-precipitated, and re-washed. The particles are finally re-dissolved in an organic solvent such as hexane or toluene.

Au particles with one phase transfer reagent and an alkylamine as the surface passivant can be prepared using an akylamine such as $C_{12}H_{25}NH_2$ or $C_{18}H_{35}NH_2$ as the surface passivant rather than an akylthiol.

Au particles with no phase transfer reagent and an alkylamine as the surface passivant can be prepared using an akylamine such as $C_{12}H_{25}NH_2$ or $C_{18}H_{35}NH_2$ as the surface passivant rather than an akylthiol, and no phase transfer reagent. A small amount of insoluble black solid particulate material is generated during the synthesis. This precipitate is removed by filtration of the two-phase system with submicron filter paper. The precipitation of the organically-functionalized metal nanocrystals then proceeds in the same manner above.

Ag particles with one phase transfer reagent and an alkylthiol as the surface passivant can be prepared using an inorganic silver compound such as $AgNO_3$ or $AgClO_4H_2O$ as the metal source, which, when dissolved in $H_2O$, yields $Ag^+$ as the active metal reagent.

Pt particles with one phase transfer reagent and an alkylamine as the surface passivant can be prepared using an akylamine such as $C_{12}H_{25}NH_2$ or $C_{18}H_{35}NH_2$ as the surface passivant and an inorganic platinum compound such as $H_2PtCl_6 3H_2O$ as the metal source, which, when dissolved in $H_2O$, yields $PtCl_6^{-2}$ as the active metal reagent.

Pd particles with one phase transfer reagent and an alkylamine as the surface passivant can be prepared using an akylamine such as $C_{12}H_{25}NH_2$ or $C_{18}H_{35}NH_2$ as the surface passivant and an inorganic palladium compound such as $Na_2PdCl_6 4H_2O$ as the metal source, which, when dissolved in $H_2O$, yields $PdCl_6^{-2}$ as the active metal reagent.

Co/Au alloy particles with two phase transfer reagents and an akylthiol as the surface passivant can be prepared as follows.

An inorganic cobalt compound (here $CoCl_2H_2O$) is dissolved in $H_2O$ to generate a solution containing $Co^{+2}$ as the active metal reagent. $Co^{+2}$ is phase transferred from $H_2O$ into an organic phase such as toluene using an excess of a phase transfer reagent or catalyst such as $(C_6H_5)_4BNa$. The aqueous layer is removed and the organic layer is washed with $H_2O$. An inorganic gold compound such as $HAuCl_4$ is dissolved in $H_2O$ to generate a solution containing $AuCl_4$ as the active metal reagent. $AuCl_4$ is phase transferred from $H_2O$ into an organic phase such as toluene using an excess of a phase transfer reagent or catalyst such as $N(C_8H_{17})_4Br$. The aqueous layer is removed and the organic layer is washed with $H_2O$. The two organic solutions are combined to form a mixture of $Co^{+2}$ and $AuCl_4$. A stoichiometric amount of an alkylthiol such as $C_{12}H_{25}SH$ dissolved in toluene is added to the organic mixture. Excess reducing agent such as $NaBH_4$ is dissolved in $H_2O$, added to the organic mixture with rapid stirring, and allowed to continue to stir for several hours. The aqueous layer is removed and discarded. The organic layer is passed through submicron filter paper (no material is removed, and all color passes through the filter paper). The organically-functionalized alloy nanocrystals are precipitated using an alcohol solution such as ethanol kept at low temperature. The filtrate is washed with this same alcohol. The particles are redissolved in an organic solvent such as toluene, re-precipitated, and re-washed. The particles are finally re-dissolved in an organic solvent such as hexane or toluene.

Solubilization of organically-functionalized nanocrystals in aqueous media can be accomplished as follows.

The nanocrystals are first prepared according to one of the synthetic schemes described above. A concentrated solution (e.g., 6 mg/ml) of the particular nanocrystals is prepared in an organic solvent such as hexane to yield an intensely-colored (e.g., purple brown, etc.) solution. A separate solution consisting of a specific weight % of a soap or detergent molecule in aqueous media is prepared. The term "soap" or "detergent" is general here and is taken to mean any molecule that has a polar (hydrophilic) ionic region and a nonpolar (hydrophobic) hydrocartion region (e.g., a fatty acid, an alkali metal alkane sulfonate salt, etc.). When dissolved in aqueous media under the appropriate conditions, these soaps and detergents will form structures called micelles. A micelle is basically any water-soluble aggregate, spontaneously and reversibly formed from amphiphile molecules. These aggregates can adopt a variety of three-dimensional structures (e.g., spheres, disks, bilayers, etc.) in which the hydrophobic moieties are segregated from the solvent by self-aggregation. If the hydrophobic portion of the amphiphile is a hydrocarbon chain, the micelles will consist of a hydrocarbon core, with the polar groups at the surface serving to maintain solubility in water. A nonpolar substance is solubilized in the hydrophobic region of these micelle structures. This is precisely the mechanism by which the soap or detergent solution the organically-functionalized nanocrystals. A known amount of the nanocrystal solution is added to a known amount of the colorless soap solution, resulting in a two-layer mixture. This mixture is stirred vigorously for a period of at least 12 hours. The color of the organic solution is transferred to the soap solution, and this signifies the solubilization of the metal nanocrystals in the aqueous media. The result is an intensely-colored single-layer solution containing a small amount of bulk metal that precipitates during the solubilization process. This metal precipitate is removed by filtration with submicron filter paper. The entire above procedure can be repeated several times in order to repeatedly increase the concentration of the metal nanocrystals in the aqueous media.

One example of a potential application of these materials concerns metal-doped matrices such as metal-doped polymer films. Thin polymer films for exmaple containing a high weight percent of metal particles may provide a route to materials with a unique combination of mechanical, dielectric, optical, electric, and even magnetic properties. However, narrow particle size distributions, coupled with uniform distribution of the particles throughout the polymer film is necessary to make these properties microscopically uniform throughout a macroscopic film. Fabricating such a film would involve preparing polymer/solvent/particle solutions with relatively high and adjustable particle/polymer weight ratios and with the particles existing as monodisperse entities in the solution. The polymer/particle thin film could then be prepared from the solution through various standard spin-coating or evaporation techniques. Other suitable matrices include sol-gels, alumina, and glassy carbon.

A second example of a potential application of these materials deals with using silver particles in reprography. There are a number of reprographic processes which have stages that intimately depend on the nucleation and growth of small silver particles. For example, small silver particles form the amplification (latent image) center in conventional photographic processes. This latent image center, formed by the action of light on silver halide crystals, acquires catalytic properties that enable it to trigger the reduction of the entire silver halide crystal to metallic silver by the reducing agent of the developer. For this process, uniform particle size distributions lead to uniform film quality, and small particle sizes lead to enhanced film resolution. Also, since gold is frequently used in small quantities as a sensitizer for photographic emulsions, the Au particles may be applicable here as well.

A third example of a potential application of these materials pertains to chemical catalysis. In catalytic processes, the size and morphology of the particle is often of great concern as it determines catalytic reactivity and selectivity. Organicaliy-functionalized nanometer-scale particles of catalytically-active metals have extremely high surface areas (a large number of catalytically active sites per particle) and unique size-dependent chemical behavior which enables their application as highly selective catalysts in a variety of homogeneous and heterogeneous catalytic processes from petroleum cracking to polymer synthesis. The Pt, Pd, and Ag particles are applicable here.

Other examples of potential applications include the use of these nanocrystals as functional units in innovative micro and nanoelectronic devices. These applications are based on the idea that two- and three-dimensional close-packed ordered arrays (superlattices) of these nanocrystals will exhibit novel electronic properties dominated by single electron phenomena, due to the quantum confined electronic properties of the individual particles as well as their collective coherence effects.

The following examples illustrate specific embodiments of the presnt invention. In the following examples all reactions were performed at room temperature, ambient pressure, and ambient atmosphere.

EXAMPLE 1

(a) 150 mg (0.380 mmol) of $HAuCl_4 \cdot 3H_2O$) was dissolved by stirring in 25 mL of deionized water to yield a clear, yellow solution;

(b) 0.365g (0.667 mmol) of $N(C_8H_{17})_4\,Br(_3)$ was dissolved by stirring in 25 mL of toluene to yield a clear solution and then added to the rapidly-stirring aqueous solution of the Au salt (solution (a)). An immediate two-layer separation resulted, with an orange/red organic phase on top and an orange-tinted aqueous phase on the bottom. This mixture is vigorously stirred until all color disappeared from the aqueous phase, indicating quantitative transfer of the $AuCl_4$ moiety into the organic phase;

(c) 0.0190 g (0.0226 ml; 0.108 mmol) of $C_{10}H_{21}SH$ was placed in 25 mL of toluene and then this mixture was added to the rapidly stirring two-phase mixture from (a) and (b);

(d) 0.151 g (4.00 mmol) of $NaBH_4$ was dissolved in 25 mL of deionized water to yield an effervescent, cloudy solution and then this mixture was added to the rapidly stirring mixture from (a), (b), and (c). There was an instant color change of the organic phase to black/brown and then quickly (1 minute) to dark purple. After 10 minutes, the aqueous layer became clear and colorless. The reaction was continued at room temperature and room pressure (kept open to ambient atmosphere) for ≈12 hour while rapidly stirring. Once the reaction time was finished, the aqueous phase was separated and discarded, and the dark purple organic phase was reduced in volume to ≈5 mL by rotary evaporation. To this 5 ml toluene/particle solution was added 350 mL of methanol and this mixture was cooled to −60° C. for twelve hours. The dark purple/black precipitate was then vacuum filtered using 0.65 µm nylon filter paper, washed with an excess of methanol (200 ml), and dried on a vacuum line to give ≈60 mg of dry product. This 60 mg of particles was re-dissolved in 50 ml of toluene, re-precipitated, and re-washed by the procedure described just previously, to yield 40 mg of dry product. The particles were finally either stored as a powder in the freezer or at room temperature, or they were re-dissolved in a preferred amount of an organic solvent (e.g., hexane, toluene, chloroform, etc.) to yield a solution with a concentration ranging from 1–30 mg/ml. These solutions were either stored in the freezer or at room temperature.

The nanoparticles were characterized by the following: (a) X-ray diffraction (XRD): This characterization, performed on a powder of the particles, showed that the particles were crystalline with diffraction peaks like those of fcc Au (except for the broadening at finite size). The main reflections were: (111) at $2\Theta$=approx. 64.6°, (311) at $2\Theta$=approx. 38.2°, (200) at $2\Theta$=approx. 44.4°, (220) at $2\Theta$=approx. 64.6°, (311) at $2\Theta$=approx. 77.5°, (222) at $2\Theta$=approx. 81.8°. Also, using diffraction peak line-width broadening, the average domain size was determined to be 70±7 Å; (b) Ultraviolet-visible spectroscopy (UV/vis): This characterization, performed on dilute hexane or toluene solutions of the nanoparticles, showed one main, broad absorption feature at $\lambda_{max}$=521 nm; (c) infrared spectroscopy (IR): This characterization, performed on a film of solid particles that were deposited on an NaCl window by evaporation of several drops of a particle/hexane solution, showed the standard C—C and C—H stretches, as well as those for the thiol group. The stretches were in the regions of 2950–2750 cm$^{-1}$, and 750–650 cm$^{-1}$; (d) Nuclear magnetic resonance spectroscopy (NMR): This characterization, performed on concentrated particle/CDC13 solutions (10 mg/ml), showed three broad multiplets at $\delta$=1.50, 1.30, and 0.90 ppm, with intensities of roughly 2:2:1. These peaks are superimposed on a fourth, very broad signal in the range of $\delta$=2.1–0.60 ppm; (f) Transmission electron miscroscopy (TEM): This characterization, performed on samples prepared by evaporating a drop of a dilute particle/hexane solution onto an amorphous carbon-coated Cu TEM grid, yielded TEM micrographs of the particles which indicated that the particles were predominantly spherical in morphology, that they were present with a broad size distribution ($\sigma \approx 20\%$), and that the average domain size was $\approx 65$ Å; (g) X-ray photoelectron spectroscopy (XPS): This characterization, performed on a uniform film of nanoparticles (several micrometers thick) supported on nylong filter paper, showed the appropriate signals for gold ($5p_{3/2}$, $4f_{7/2}$, $4f_{5/2}$, $4d_{5/2}$, $4d_{3/2}$, and $4p_{3/2}$ at $\approx 59, 84, 87, 336, 355,$ and 548 eV, respectively), carbon (1s at $\approx 285.3$ eV), and Oxygen (1s at $\approx 531.8$ eV). Also observed were signals for Br ($3p_{3/2}$ peak at 183.5 eV, $3p_{1/2}$ peak at 189.5 eV, and 3d peak at $\approx 68.0$ ev). The peak positions, line shapes, and peak-to-peak distance of the Au 4f doublet are the standard measure of the gold oxidation state. The ginding energies for the Au 4f doublet are 83.5(3) and 87.2(3) eV (peak-to-peak distance of 3.7 eV). These measurements are consistent with the Au° oxidation state; (h) Elemental analysis (EA): The analyses yielded 77.06% Au, 2.99% S, 2.86% H, and 17.14% C. The corresponding Au: S molar ratio of the nanoparticles was 4.20:1, and the C:H and C:S ratios are those of neat decanethiol, within experimental uncertainties; (i) Differential scanning calorimetry (DSC): This characterization, performed on a 6 mg sample (dry powder) of nanoparticles, showed a broad, endothermic transition beginning at $\approx 95°$ C. and peaking at 120° C. (18 J/g); (j) Thermogravimetric analysis (TGA): This characterization, performed on a 5 mg sample (dry powder) of nanoparticles, showed a maximal rate of weight loss at approximately 235° C. The total weight loss was found to be consistent with the total amount of bonded ligands found by elemental analysis; (k) Solubility tests: This characterization, performed on dry powder samples of nanoparticles yiedled excellent solubility in hexane, toluene, chloroform, dichloromethane, pyridine, benzene, and several other organic solvents. Maximum solubility was found to be in the range 20–30 mg/ml.

EXAMPLE 2

(a) 112 mg (0.284 mmol) of $HAuCl_4 3H_2O_{(3)}$ was dissolved by stirring in 25 mL of deionized water to yield a clear, yellow solution;

(b) 0.363 g (0.666 mmol) of $N(C_8H_{17})_4Br_{(2)}$ was dissolved by stirring in 25 mL of toluene to yield a clear solution and then added to the rapidly-stirring aqueous solution of the Au salt (solution (a)). An immediate two-layer separation resulted, with an orange/red organic phase on top and an orange-tinted aqueous phase on the bottom. This mixture is vigorously stirred until all color disappeared from the aqueous phase, indicating quantitative transfer of the $AuCl_4$ moiety into the organic phase;

(c) 0.574 g (3.10 mmol) of $C_{12}H_{25}NH_{2(5)}$ (dodecylamine) was placed in 25 mL of toluene and then this mixture was added to the rapidly stirring two-phase mixture from (a) & (b). Upon the addition of this solution, the aqueous layer immediately became beige/murky white;

(d) 0.165 g (4.86 mmol) of $NaBH_4$ was dissolved in 25 mL of deionzaed water to yield an effervescent, cloudy solution and then this mixture was added to the rapidly stirring mixture from (a), (b), and (c). There was an instant color change of the organic phase to black/brown and then quickly (1 minute) to dark purple. After 10 minutes, the aqueous layer became clear and colorless. The reaction was continued at room temperature and room pressure (kept open to ambient atmosphere) for $\approx 12$ hour while rapidly stirring. Once the reaction time was finished, the aqueous phase was separated and discarded, and the dark purple organic phase was reduced in volume to $\approx 5$ mL by rotary evaporation. To this 5 mi toluene/particle solution was added 350 mL of methanol and this mixture was cooled to −60° C for twelve hours. The dark purple/black precipitate was then vacuum filtered using 0.65 $\mu$m nylon filter paper, washed with an excess of methanol (200 ml), and dried on a vacuum line to give $\approx 60$ mg of dry product. This 60 mg of particles was re-dissolved in 50 ml of toluene, re-precipitated, and re-washed by the procedure described just previously, to yield 60 mg of dry product. The particles were finally either stored as a powder in the freezer or at room temperature, or they were re-dissolved in a preferred amount of an organic solvent (e.g., hexane, toluene, chloroform, etc.) to yield a solution with a concentration ranging from 1–30 mg/ml. These solutions were either stored in the freezer or at room temperature. When stored as powders at room temperature, the particles exhibit a certain degree a metastability. That is, the particles are unstable with respect to particle aggregation and quickly lose their solubility over a matter of a few days.

The nanoparticles were characterized by the following: (a) X-ray diffraction (XRD): This characterization, performed on a powder of the particles, showed that the particles were crystalline with diffraction peaks like those of fcc Au (except for the broadening at finite —size). The main reflections were: (111) at $2\Theta$ approx. 38.2°, (200) at $\Theta$=approx. 44.4°, (220) at $2\Theta$ approx. 64.6°, (311) at $2\Theta$=approx. 77.5°, (222) at $2\Theta$=approx. 81.8°. Also, using diffraction peak line-width broadening, the average domain size was determined to be $26 \mp 3$ Å; (b) Ultraviolet-visible spectrscopy (UV/vis): This characterization, performed on dilute hexane or toluene solutions of the nanoparticles, showed one main, broad absorption feature at $\lambda_{max}$=517 nm;

(c) infrared spectroscopy (IR): This characterization, performed on a film of solid particles that were deposited on an NaCl window by evaporation of several drops of a particle/hexane solution, showed dodecylamine bands in the regions from ≈3310–2990 cm$^{-1}$ (N—H stretch), ≈3000–2850 cm$^{-1}$ (C—H allphatic stretch), ≈1700–1300 cm$^{-1}$ (N—H band@1600 cm$^{-1}$ and $CH_2$ scissor@1450 cm$^{-1}$), ≈1100–1050 cm$^{-1}$ (C—N stretch), and ≈900–700 cm$^{-1}$ (N—H wag); (d) Nuclear magnetic resonance spectroscopy (NMR): This characterization, performed on concentrated particles/CDCl3 solutions (10 mg/ml), showed three broad multiplets at δ=1.56, 1.35, and 85 ppm, with intensities of roughly 2:2:1. These peaks are superimposed on a fourth, very broad signal in the range of δ=2.0–0.50 pp; (e) Mass spectroscopy (MS): This characterization, performed on solid samples, showed the typical fragmentation pattern of straight-chain primary amines as well as molecular ion peaks of the amines. MS ($Au_x$dodecylamine$_y$), m/e (%); 30(100%) [—$Cl_2NH_2$]$^+$, 185 (M$^+$, 4%) [$C_{12}H_{27}N$]$^+$; (f) Transmission electron microscopy (TEM): This characterization, performed on samples prepared by evaporating a drop of a dilute particle/hexane solution onto an amorphous carbon-coated Cu TEM grid, yielded TEM micrographs of the particles which indicated that the particles were predominantly spherical in morphology, that they were present with a broad size distribution (σ≈20%), and that the average domain size was ≈30 Å; (g) X-ray photoelectron spectroscopy (XPS): This characterization, performed on a uniform film of nanoparticles (several micrometers thick) supported on nylon filter paper, showed the appropriate signals for gold ($5p_{3/2}$, $4f_{7/2}$, $4f_{5/2}$, $4d_{5/2}$, $4d_{3/2}$, and $4p_{3/2}$ at ≈59, 84, 87, 336, 366, and 548 eV, respectively), carbon (1s at ≈285.3 eV), and Oxygen (1s at ≈531.8 eV). Also observed were signals for Br ($3p_{3/2}$ peak at 183.5 eV, $3p_{1/2}$ peak at 189.5 eV, and 3d peak at ≈68.0 ev). The peak positions, line shapes, and peak-to-peak distance of the Au 4f doublet are the standerd measure of the gold oxidation state. The binding energies for the Au 4f doublet are 83.5(3) and 87.2(3) eV (peak-to-peak distance of 3.7 eV). These measurements are consistant with the Au° oxidation state; (h) Elemental analysis (EA): The analyses yielded 89.12% Au, 0.79% N, 2.00% H, and 9.20% C. The corresponding Au:N molar ratio of the nanoparticles was 7.9:1, and the C:H and C:N ratios are those of neat dodecylamine, within experimental uncertainties; (i) Differential scanning calorimetry (DSC): This characterization, performed on a 7 mg sample (dry powder) of nanoparticles, showed a broad, exothermic transition(s) extending from ≈50° C. to 130° C., which includes a relatively sharp endothermic feature centered at 90° C. (7 J/g); (j) Thermogravimetric analysis (TGA): This characterization, performed on a 5 mg sample (dry powder) of nanoparticles, showed a maximal rate of weight loss at approximately 250° C. The total weight loss was found to be consistent with the total amount of bonded ligands found by elemental analysis; (k) Solubility tests: This characterization, performed on dry powder samples of nanoparticles yielded excellent solubility in hexane, toluene, chloroform, dichloromethane, pyridine, benzene, and several other organic solvents. Maximum solubility was found to be in the range of 22–30 mg/ml.

EXAMPLE 3

The process of EXAMPLE 2 was repeated except that no phase transfer reagent was used, a small amount of insoluble black-solid particulate material was generated during the synthesis, and this precipitate was removed by filtration of the two-phase system with submicron filter paper just before the precipitation step. That is, the insoluble precipitate was removed by filtration of the two-phase system with 0.66 micron filter paper. The aqueous phase was then separated and discarded, and the dark-purple organic phase was reduced in volume to ≈5 mL by rotary evaporation. The particles were then precipitated, re-precipitated, and stored in the manner described in EXAMPLE 2.

Particle composition, size, and properties may be varied by means of the following changes: the variation of the metal precursor used, the variation of phase transfer reagents used or their omission from the synthetic procedure, the variation of one or more surface passivants used, the variation of the reducing agent used, or the variation of some of the reactant molar ratios, or any combination thereof.

The nanoparticles were charactarized by the following: (a) X-ray diffraction (XRD): This characterization, performed on a powder of the particles, showed that the particles waee crystalline with diffraction peaks like those of fcc Au (except for the broadening at finite size). The main raflections were: (111) at 2Θ=approx. 38.2°, (200) at 2Θ=approx. 44.4°, (220) at 2Θ=approx. 64.6°, (311) at 2Θ=approx. 77.5°, (222) at 2Θ=approx. 81.8°. Also, using diffraction peak line-widthi broadening, the average domain size was determined to be 55±7 Å; (b) Ultraviolet-visible spectroscopy (UV/vis): This characterization, performed on dilute hexane or toluene solutions of the nanoparticles, showed one main, broad absorption feature at $\lambda_{max}$=525 mn; (c) infrared spectroscopy (IR): This characterization, performed on a film of solid particles that were deposited on an NaCl window by evaporation of several drops of a particle/hexane solution, showed dodecylamine bands in the regions from ≈3310–2990 cm$^{-1}$ (N—H stretch), ≈3000–2850 cm$^{-1}$ (C—H aliphatic stretch), ≈1700–1300 cm$^{-1}$ (N—H bend@1600 cm$^{-1}$ and $CH_2$ scissor@1450 cm$^{-1}$), ≈1100–1050 cm$^{-1}$ (C—N stretch), and ≈900–700 cm$^{-1}$ (N—H wag); (d) Nuclear magnetic resonance spectroscopy (NMR): This characterization, performed on concentrated particle/CDCl3 solutions (10 mg/ml), showed three broad multiplets at δ1.54, 1.32, and 0.85 ppm, with intensities of roughly 2:2:1. These peaks arr superimposed on a fourth, very broad signal in the range of δ2.0–0.50 ppm; (a) Mass spectroscopy (MS): This characterization, performed on solid samples, showed the typical fragmentation pattern of straight-chain primary amines as well as molecular ion peaks of the amines. MS ($Au_x$dodecylamine$_y$), m/e (%): 30(100%) [—$CH_2NH_2$]$^+$, 185 (M$^+$, 4%) [$C_{12}H_{27}N$]$^+$; (f) Transmission electron microscopy (TEM): This characterization, performed on samples prepared by evaporating a drop of a dilute particle/hexane solution onto an amorphous carbon/coated Cu TEM grid, yielded TEM micrographs of the particles which indicated that the particles were predominantly spherical in morphology, that they were present with a broad size distribution (σ≈20%), and that the average domain size was ≈50 Å; (g) X-ray photoelectron spectroscopy (XPS): This characterization, performed on a uniform film of nanoparticles (several micrometers thick) supported on nylon filter paper, showed the appropriate signals for gold ($5p_{3/2}$, $4f_{7/2}$, $4f_{5/2}$, $4d_{5/2}$, $4d_{3/2}$, and $4p_{3/2}$ at ≈59, 84, 87, 336, 366, and 548 eV, respectively), carbon (1s at ≈285.3 eV), and Oxygen (1s at ≈531.8 eV). Signals for Br ($3p_{3/2}$ peak at 183.5 eV, $3p_{1/2}$ peak at 189.5 eV, and 3d peak at ≈68.0 ev) were not observed. The peak positions, line shapes, and peak-to-peak distance of the Au 4f doublet are the standard measure of the gold oxidation state. The binding energies for the Au 4f doublet are 83.5(3) and 87.2(3) eV (peak-to-peak distance of 3.7 eV). These measurements are consistent with the Au° oxidation state:

(h) Elemental analysis (EA): The analyses yielded 90.58% Au, 0.75% N, 1.69% H, and 9.51% C. The corresponding Au:N molar ratio of the nanoparticles was 8.6:1, and the C:H and C:N ratios are those of neat dodecylamine, within experimental uncertainties; (i) Differential scanning calorimetry (DSC): This characterization, performed on a 8 mg sample (dry powder) of nanoparticles, showed a strong, broad, exothermic transition beginning at ≈50° C. with a relatively sharp, and relatively endothermic feature peaking near 110° C. (4 J/g); (j) Thermogravimetric analysis (TGA): This characterization, performed on a 5 mg sample (dry powder) of nanoparticles, showed a maximal rate of weight loss at approximately 250° C. The total weight loss was found to be consistent with the total amount of bonded ligands found by elemental analysis; (k) Solubility tests: This characterization, performed on dry powder samples of nanoparticles yielded excellent solubility in hexane, toluena, chloroform, dichloromethane, pyridine, benzene, and several other organic solvents. Maximum solubility was found to be in the range of 22–30 mg/ml.

EXAMPLE 4

(a) 547 mg of $(C_8H_{17})_4NBr$ (phase transfer reagent) was dissolved in 10 ml of toluene and sonnicated for 2 minutes;

(b) 119 mg of $CoCl_2 6H_2O$ was dissolved in 15 ml of $H_2O$ by sonnication for 15 minutes;

(c) The toluene and aqueous solutions from steps (a) and (b), respectively, were combined and stirred together for 15 minutes, which resulted in a blue-colored toluene layer. The aqueous phase was then separated from the organic phase and discarded;

(d) 98 mg of $HAuCl_4$ was dissolved in 15 ml $H_2O$ and then mixed with a 137 mg $(C_8H_{17})_4NBr$ in 20 ml toluene solution. The $AuCl_4$ ions were transferred from the aqueous to the toluene phase (organic Phase color becomes red/orange) and then the aqueous phase was separated and discarded;

(e) The two solutions of metal precursors (1:2 Au:Co molar ratio) in toluene (solutions from step (c) and (d)) were merged and stirred for 5 minutes;

(f) 0.36 ml of $C_{12}H_{25}SH$ (surface passivant) was added to the toluene solution from (e) and stirred for 2 minutes. The mixture tured blue/gray in color;

(g) A solution of 283 mg $NaBH_4$ (reducing agent) in 3 ml $H_2O$ was added to the toluene phase from step (f) and the reaction was allowed to proceed for 6 hours while stirring. Then, the black-colored toluene phase was separated from the aqueous phase and rotary evaporated down to 5 ml. The concentrated solution was put in a freezer for 12 hours and then filtered, while cold, to remove phase transfer reagent that had crystallized out of the organic phase solution. The nanoparticles, still dissolved in the organic phase, were then precipitated by the addition of 300 ml of methanol. The particles/toleune/methanol solution was sonnicated for 10 min and then filtered through 0.2 µm nylon filter paper. The filtrate was clear and the particles were black. The weight of residue on the filter paper was 41 mg. This residue was re-dissolved in 5 ml toluene, and the solution was sonnicated for 15 minutes and filtered. Then, the particles were precipitated again (using 200 ml of methanol) and filtered. The weight of the re-soluble, final residue was 20 mg. The particles were finally either stored as a powder in the freezer or at room temperature, or they were re-dissolved in a preferred amount of an organic solvent (e.g., hexane, toluene, chloroform, etc.) to yield a solution with a concentration ranging from 1–30 mg/ml. These solutions were either stored in the freezer or at room temperature.

The nanoparticles were characterized by the following materials characterization techniques:

(a) X-ray diffraction (XRD): This characterization, performed on a powder of the particles, showed that the particles were crystalline with diffraction peaks like those of fcc Au (except for the broadening at finite size). The main reflections were: (111) at 2Θ≈approx. 38.2°, (200) at 2Θ≈approx. 44.4°, (220) at 2Θ≈approx. 64.6°, (311) at 2Θ≈approx. 77.5°, (222) at 2Θ≈approx. 81.8°. Cobalt reflections were masked by those of gold. Also, using diffraction peak line-width broadening, the average domain size was determined to be 30±5 Å; (b) Ultraviolet/visible spectroscopy (UV/vis); This characterization, performed on dilute hexane or toluene solutions of the nanoparticles, showed one main, broad absorption feature at $\lambda_{max}$=520 nm; (c) Infrared spectroscopy (IR): This characterization, performed on a film of solid particles that were deposited on an NaCl window by evaporation of several drops of a particle/hexane solution, showed the standard C—C and C—H stretches, as well as those for the thiol group. The stretches were in the regions of 2950–2750 $cm^{-1}$, 1500–1200 $cm^{-1}$, and 750–650 $cm^{-1}$;(d) Transmission electron microscopy (TEM): This characterization, performed on samples prepared by evaporating a drop of a dilute particle/hexane solution onto an amorphous carbon-coated Cu TEM grid, yielded TEM micrographs of the particles which indicated that the particles were predominantly spherical in morphology, that they were present with a relatively narrow size distribution (σ≈10%), and that the average domain size was ≈30 Å; (e) X-ray, photoelectron spectroscopy (XPS): This characterization, performed on a uniform film of nanoparticles (several micrometers thick) supported on nylon filter paper, showed the appropriate signals for gold ($5p_{3/2}$, $4f_{7/2}$, $4f_{5/2}$, $4d_{5/2}$, $4d_{3/2}$, and $4p_{3/2}$ at ≈59, 84, 87, 336, 366, and 548 eV, respectively), carbon (1s at ≈285.3 eV), and Oxygen (1s at ≈531.8 eV). The peak positions, line shapes, and peak-to-peak distance of the Au 4f doublet are the standard measure of the gold oxidation state. The binding energies for the Au 4f doublet are 83.5(3) and 87.2(3) eV (peak-to-peak distance of 3.7 eV). These measurements are consistent with the Au oxidation state. Also observed were the signals for cobalt (3s at 57 ev; $2p_{3/2}$ and $2p_{1/2}$ at 779 ev and 794 ev, respectively) and sulfur ($2p_{3/2}$ and $2p_{1/2}$ at 163 ev and 164 ev, respectively). An analysis of the XPS data revealed that the Co/Au alloy was comprised of about 3% Co and 97% Au; (f) Solubility tests: This characterization, performed on dry powder samples of nanoparticles yielded excellent solubility in hexane, toluene, chloroform, dichloromethane, pyridine, benzene, and several other organic solvents. Maximum solubility was found to be in the range of 20–30 mg/ml.

EXAMPLE 5

(a) 10 g of DDAB was dissolved in 104 ml of toluene and sonnicated for 10 minutes;

(b) 119 mg of $CoCl_2 6H_2O$ was dissolved in the DDAS/toluene solution and sonnicated for 5 hours to dissolve all of the Co salt in the toluene. The $CoCl_2$/DDAB/toluene solution had a typical cobalt blue color;

(c) 98 mg $HAuCl_4$ was dissolved in 15 ml $H_2O$ and mixed with a 137 mg $(C_8H_{17})_4NBr$ in 20 ml toluene solution. The $AuCl_4$ ions were transferred from the aqueous to the toluene phase (organic phase color becomes red/orange) and then the aqueous phase was separated and discarded;

(d) The two solutions (from steps (b) and (c)) of metal precursors (1:2 Au:Co molar ratio) in toluene were merged and stirred for 5 minutes. The solution had a dark green color;

(e) 0.18 ml of $C_{12}H_{25}SH$ (surface passivant) was added to the toluene solution from (d) and stirred for 2 minutes. The solution turned blue again;

(f) A solution of 283 mg $NaBH_4$ (reducing agent) in 3 ml $H_2O$ was added to the toluene phase resulting from step (a), and the reaction was allowed to proceed for 5 hours while stirring. After 5 hours of reaction time, the toluene phase was diluted with 200 ml a toluene and washed with 500 ml of $H_2O$. A viscous, white DDAB/water emulsion was formed and allowed to precipitate out of the thiol-capped Au/Co particles/toluene solution. The black particle/toluene solution was then separated and rotary evaporated to a concentrated 10 ml solution. 500 ml of methanol was then added to precipitate the particles. The particles/toluene/methanol solution was sonnicated for 30 min and then filtered through a 0.2 μm nylon filter paper. The filtrate was clear and the particles were black. The weight of residdue on the filter paper was 69 mg. The residue was re-dissolved in 100 ml of toluene by sonnication for 15 minutes and the solution was then filtered. 31 mg of the residue were not dissolved. The toluene solution was rotary evaporated down to 5 ml and the particles were precipitated again by addition of 300 ml of methanol and 15 minutes sonnication. After filtering, the weight of the resoluble, final residue was 21 mg. The particles were finally either stored as a powder in the freezer or at room temperature, or they were re-dissolved in a preferred amount of an organic solvent (e.g., hexane, toluene, chloroform, etc.) to yield solution with a concentration ranging from 1–30 mg/ml. These solutions were either stored in the freezer or at room temperature.

The nanoparticles synthesized by the above procedures were characterized by the following materials characterization techniques:

(a) X-ray diffraction (XRD): This characterization, performed on a powder of the particles, showed that the particles were crystalline with diffraction peaks like those of fcc Au (except for the broadening at finite size). The main reflections were: (111) at 2Θ=approx. 38.2°, (200) at 2Θ=approx. 44.4°, (220) at 2Θ=approx. 64.6°, (311) at 2Θ=approx. 77.5°, (222) at 2Θ=approx. 81.8°. Cobalt reflections were masked by those of gold. Also, using diffraction peak line-width broadening, the average domain size was determined to be 15±2 Å; (b) Ultraviolet-visible spectroscopy (UV/vis): This characterization, performed on dilute hexane or toluene solutions of the nanoparticles, showed one main, broad absorption feature at $\lambda_{max}$=517 nm; (c) Infrared spectroscopy (IR): This characterization, performed on a film of solid particles that were deposited on an NaCl window by evaporation of several drops of a particle/hexane solution, showed the standard C—C and C—H stretches, as well as those for the thiol group. The stretches were in the regions of 2950–2750 $cm^{-1}$, 1500–1200 $cm^{-1}$, and 750–450 $cm^{-1}$; (d) Transmission electron microscopy (TEM): This characterization, performed on samples preppared by evaporating a drop of a dilute particle/hexane solution onto an amorphus carbon/coated Cu TEM grid, yielded TEM micrographs of the particles which indicated that the particles were predominently sphericaal in morphology, that they were present with a relatively narrow size distribution (σ≈7%), and that the average domain size was ≈15 Å; (e) X-ray photoelectron spectroscopy (XPS): This characterization, performed on a uniform film of nanoparticles (several micrometers thick) supported on nylon filter paper, showed the appropriate signals for gold ($5p_{3/2}$, $4f_{7/2}$, $4f_{5/2}$, $4d_{5/2}$, $4d_{3/2}$, and $4p_{3/2}$ at ≈59, 84, 87, 336, 366, and 548 eV, respectively), carbon (1s at ≈285.3 eV), and Oxygen (1s at ≈531.8 eV). The peak positions, line shapes, and peak-to-peak distance of the Au 4f doublet are the standard measure of the gold oxidation state. The binding energies for the Au 4f doublet are 83.5(3) and 87.2(3) eV (peak-to-peak distance of 3.7 eV). These measurements are consistent with the Au° oxidation state. Also observed were the signals for cobalt (3s at 57 ev; $2p_{3/2}$ and $2p_{1/2}$ at 779 ev and 794 ev, respectively) and sulfur ($2p_{3/2}$ and $2p_{1/2}$ at 163 ev and 164 ev, respectively). An analysis of the XPS data revealed that the Co/Au alloy was comprised of about 2% Co and 98% Au; (f) Solubility tests: This characterization, performed on dry powder samples of nanoparticles yielded excellent solubility in hexane, toluene, chloroform, dichloromethane, pyridine, benzene, and several other organic solvants. Maximum solubility was found to be in the range of 20–30 mg/ml.

EXAMPLE 6

(a) Dodecanethiol-functionalized Ag nanocrystals (average domain size of 3 nm) were first prepared according to the procedure of EXAMPLE 1, except that $AgNO_3$ was used as the metal source and dodecanethiol was used as the thiol;

(b) A 6 mg/ml solution of the Dodecanethiol-functionalized Ag nanocrystals was prepared by dissolving 24 mg of particles in 4 ml of hexane to yield an intensely-colored (dark brown) solution;

(c) A separate solution (micelle solution) consisting of 20 g of sodium dodecylsulfate (SDS) dissolved in 300 ml of deionized $H_2O$ was prepared. This yielded a 6.25 weight percent solution of SDS in $H_2O$; (d) 1 ml of the 6 mg/ml Ag particle/hexane solution was added to 20 ml of the 6.25 weight percent solution of SDS in $H_2O$ resulting in a two-layer mixture (organic layer on top and aqueous layer on the bottom). This mixture was stirred vigorously for a period of 6 hours. The dark-brown color of the organic solution is transferred to the aqueous micelle solution to yield an amber-colored single phase system (no two layar separation exists anymore). This signifies the solubilization of the metal nanocrystals in the aqueous media. As a by-product of this solubilization procedure, a small amount of bulk metal precipitates. This metal precipitate was removed by filtration with 0.65 micron nylon filter paper to yield 1 mg of black, insoluble particulate material. The entire above procedure was repeated several times in order to increase the concentration of the metal nanocrystals in the aqueous media. A concentration of 0.10 mg/ml (0.01 wt. % Ag) was ultimately achieved here.

The aqueous solutions of nanoparticles were characterized by the following techniques: (a) Ultraviolet-visible spectroscopy (UV/vis): This characterization, performed on dilute particle/hexane/SDS/watar solutions, showed one main, broad absorption featurre at $\lambda_{max}$=450 nm (this represents the characteristic optical signature of monodisperse silver colloids); (b) Transmission electron microscopy (TEM): This characterization, performed on samples prepared by evaporating a drop of a dilute particle/hexane/SDS/water solution onto an amorphous carbon-coated Cu TEM grid, yielded TEM micrographs of the particles which indicated that the particles were present with the same structural properties (e.g., shape, size, and size distribution) as those of the original dodecanethiol/functionalized Ag nanocrystals used for solubilization. Specifically, this analysis showed that the particles were predominantly spherical in morphology, that they were present with a relatively narrow size distribution (σ≈10%), and that the average domain size was ≈30 Å.

EXAMPLE 7

(a) 225 mg (,510 mmol) of $H_2PtCl_8 5H_2O_{(6)}$ was dissolved by stirring in 25 mL of deionized water to yield a clear, orange-yellow solution;

(b) 0.620 g (1.13 mmol) of $N(C_8H_{17})_4Br_{(8)}$ was dissolved by stirring in 25 mL of toluene to yield a clear solution and then added to the rapidly-stirring aqueous solution of the Pt salt (solution (a)). An immediate two-layer separation resulted, with an orange/red organic phase on top and an orange-yellow (tinted) aqueous phase on the bottom. This mixture is vigorously stirred until all color disappeared from the aqueous phase, indicating quantitative transfer of the $PtCl_6^{-2}$ moiety into the organic phase;

(c) 0.095 g (0.511 mmol) of $C_{12}H_{25}NH_{2(6)}$ (dodecylamine) was placed in 25 mL of toluene and then this mixture was added to the rapidly stirring two-phase mixture from (a) and (b). Upon the addition of this solution, the aqueous layer immediately became beige/white; (d) 0.212 g (5.61 mmol) of $NaBH_4$ was dissolved in 25 mL of deionized water to yield an effervescent, cloudy solution and then this mixture was added to the rapidly stirring mixture from (a), (b) and (c). There was an instant color change of the organic phase to black/brown and then quickly (1 minute) to dark brown. After 5 minutes, the aqueous layer became clear and colorless. The reaction was continued at room temperature and room pressure (kept open to ambient atmosphere) for ≈12 hour while rapidly stirring. Once the reaction time was finished, the aqueous phase was separated and discarded, and the dark-brown organic phase was reduced in volume to ≈5 mL by rotary evaporation. To this 5 ml toluene/particle solution was added 350 mL of methanol and this mixture was cooled to –60° C. for twelve hours. The dark-brown precipitate was then vacuum filtered using 0.65 µm nylon filter paper, washed with an excess of methanol (220 ml), and dried on a vacuum line to give ≈55 mg of dry product. This 55 mg of particles was re-dissolved in 50 ml of toluene, re-precipitated, and re-washed by the procedure described just previously, to yield 47 mg of dry product. The particles were finally either stored as a powder in the freezer or at room temperature, or they were re-dissolved in a preferred amount of an organic solvent (e.g., hexane, toluene, chloroform, and the like) to yield a solution with a concentration ranging from 1–30 mg/ml. These solutions were either stored in the freezer or at room temperature.

The nonoparticles characterized by the following:
(a) X-ray diffraction (XRD): This characterization, performed on a powder of the particles, showed that the particles were crystalline with diffraction peaks like those of fcc Pt (except for the broadening at finite size). The main reflections were: (111) at 2Θ=approx. 38.2°, (200) at 2Θ+= approx. 44.4°, (220) at 2Θ=approx. 64.6°, (311) at 2Θ=approx. 77.5°, (222) at 2Θ=approx. 81.8°. Also, using diffraction peak line-width broadening, the average domain size was determined to be 30±4 Å; (b) Ultraviolet-viswible spectroscopy (UV/vis): This characterization, performed on dilute hexane or toluene solutions of the nanoparticles, did not show an absorption feature in the visible spectrum between 300–800 nm (this is as expected because Pt is not a 'one-electron' metal); (c) infrared spectroscopy (IR): This characterization, performed on a film of solid particles that were deposited on an NaCl window by evaporation of several drops of a particle/hexane solution, showed dodecylamine bands in the regions from ≈3310–2990 cm$^{-1}$ (N—H stretch), ≈3000–2850 cm$^{-1}$ (C—H aliphatic stretch), ≈1700–1300 cm$^{-1}$ (N—H bend@1600 cm$^{-1}$ and $CH_2$ scissor@1450 cm$^{-1}$), ≈1100–1050 cm$^{-1}$ (C—N stretch), and ≈900–700 cm$^{-1}$ (N—H wag); (d) Nuclear magnetic resonance spectroscopy (NMR): This characterization, performed on concentrated particle/CDCl3 solutions (10 mg/ml), showed three broad multiplets at δ=1.56, 1.34, and 0.87 ppm, with intensities of roughly 2:2:1. These peaks are superimposed on a fourth, very broad signal in the range of δ=2.1–0.55 ppm; (e) Transmission electron microscopy (TEM): This characterization, performed on samples prepared by evaporating a drop of a dilute particle/hexane solution onto an amorphous carbon-coated Cu TEM grid, yielded TEM micrographs of the particles which indicated that the particles were predominantly spherical in morphology, that they were present with a relatively narrow size distribution (σ≈15%), and that the average domain size was ≈26 Å; (f) Solubility tests: This characterization, performed on dry powder samples of nanoparticles yielded excellent solubility hexane, toluene, chloroform, dichloromethane, pyridine, benzene, and several other organic solvents. Maximum solubility was found to be in the range of 25–30 mg/ml.

EXAMPLE 8

(a) 197 mg (0.450 mmol) of $Na_2PdCl_8 4H_2O_{(8)}$ was dissolved by stirring in 25 mL of deionized water to yield a clear, gray/black solution;

(b) 0.494 g (0.900 mmol) of $N(C_8H_{17})_4Br_{(8)}$ was dissolved by stirring in 25 mL of toluene to yield a clear solution and then added to the rapidly-stirring aqueous solution of the Pd salt (solution (a)). An immediate two-layer separation resulted. This mixture is vigorously stirred until all color disappeared from the aqueous phase, indicating quantitative transfer of the $PtCl_8^{-2}$ moiety into the organic phase (black);

(c) 0.086 g (0.465 mmol) of $C_{12}H_{25}NH_{2(8)}$ (dodecylamnine) was placed in 25 mL of toluene and then this mixture was added to the rapidly stirring two-phase mixture from (a) & (b). Upn the addition of this solution, the aqueous layer immediately became beige/white;

(d) 0.171 g (4.52 mmol) of $NaBH_4$ was dissolved in 25 mL of deionized water to yield an effervescent, cloudy solution and then this mixture was added to the rapidly stirring mixture from (a), (b), and (c). There was an instant color change of the organic phase to dark black. After 5 minutes, the aqueous layer became clear and colorless. The reaction was continued at room temperature and room pressure (kept open to ambient atmosphere) for ≈12 hour while rapidly stiring. Once the reaction time was finished, the aqueous phase was separated and discarded, and the dark-black organic phase was reduced in volume to ≈5 mL by rotary evaporation. To this 5 ml toluene/particle solution was added 350 mL of methanol and this mixture was cooled to –60° C. for twelve hours. The dark-black precipitate was then vacuum filtered using 0.65 µm nylon filter paper, washed with an excess of methanol (200 ml), and dried on a vacuum line to give ≈50 mg of dry product. This 50 mg of particles was re-dissolved in 50 ml of toluene, re-precipitated, and re-washed by the procedure described just previously, to yield 39 mg of dry product. The particles were finally either stored as a powder in the freezer or at room temperature, or they were re-dissolved in a preferred amount of an organic solvent (e.g., hexane, chloroform, etc.) to yield a solution with a concentration ranting from 1–30 mg/ml. These solutions were either stored in the freezer or at room temperature.

The nanoparticles were characterized by the following:
(a) X-ray diffraction (XRD): This characterization, performed on a powder of the particles, showed that the particles were crystalline with diffraction peaks like those of fcc Pd (except for the broadening at finite size). The main reflections were: (111) at 2Θ=approx. 38.2°, (200) at 2Θ=approx. 44.4°, (220) at 2Θ=approx. 77.5°, (311) at 2Θ=approx. 77.5°, (222) at 2Θ=approx. 81.8°. Also, using diffraction peak line-width broadening, the average domain size was determined to be 20±3 Å; (b) Ultraviolet-visible spectroscopy (uV/vis): This characterization, performed on dilute hexane or toluene solutions of the nanoparticles, did not show an absorption feature in the visible spectrum between 300–800 nm (this is as expected because Pd is not a 'one-electron' metal); (c) Infrared spectroscopy (IR): This characterization, performed on a film of solid particles that were deposited on an NaCl window by evaporation of several drops of a particle/hexane soution, showed dodecylamine bands in the regions from ≈3310–2990 $cm^{-1}$ (N—H stretch), ≈3000–2850 $cm^{-1}$ (C—H aliphatic strech), ≈1700–1300 $cm^{-1}$ (N—H bend@1600 $cm^{-1}$ $CH_2$ scissor@1450 $cm^{-1}$), ≈1100–1050 $cm^{-1}$ (C—H stretch), and ≈900–700 $cm^{-1}$ (N—H wag); (d) Nuclear magnetic resonance spectroscopy (NMR): This characterization, performed on concentrated particle/CDCl3 solutation (10 mg/ml), showed three broad multiplets at δ=1.54, 1.36, and 192 ppm, with intesities of roughtly 2:2:1. These peaks are superimposed on a fourth, very broad signal in the range of δ=2.1–0.60 ppm; (e) Transmission electron microscopy (TEM): This characterization, performed on samples prepared by evaporating a drop of a dilute particle/hexane solutation onto an amorphous carbon-coated Cu TEM grid, yielded TEM micrographs of the particles which indicated that the particles were predominatly spherical in morphology, that they were present with a relatively narrow size distribution (σ≈10%), and that the average domain size was ≈18 Å; (f) Solubility tests: This characterization, performed on dry powder samples of nanoparticles yielded excellent solubility hexane, toluene, chloroform, dichloromethane, pyridine, benzene and several other organic solvents. Maximum solubility was found to be in the range of 25–30 mg/ml.

EXAMPLE 9

(a) 10 mg of dodecanethiol-capped Ag nanocrystals prepared according to the procedure of Example 6 and having an average domain size of approximately 30 Å was added to 10 mg of polystyrene and then mixed with 2 ml of toluene (effectively a 50% by weight Ag film because the toluene evaporates during spin coating procedures);

(b) the 2 ml mixture from (a) was then spin coated onto a glass substrate (which contained patterned Al electrodes) at a rate of 3600 RPM, to generate a thin metal nanocrystal-doped polymer thin film;

(c) After evaporating a top Al electrode onto the thin film, dielectric, optical and film thickness measurements were carried out.

The film thickness was measured by profilometry to be 20 μm. The dielectric measurements of the metal nanocrystal-doped polymer thin film yielded unique dielectric values as copared to the 'pure' or un-doped polymer. The dielectric characteristics for the undoped polymer thin filme were: a) dielectric constant=2; b) breadown voltage—12 kv/mm. The dielectric characteristics for the metal nanocrystal-doped polymer thin film were: a) dielectric constant—15; b) breadown voltate—1.2 kv/mm. As can be seen, the dielectric constant of the doped film increases by about a factor of 10. There is one broad absorption feature at $\lambda_{max}$=465 nm. This feature is shifted to the red of that expected for just the nanoparticles in solution themselves (i.e. particles not part of a doped polymer film).

The fabrication methods discussed above may be used to prepare a range of novel metal nanocrystal-doped polymer thin film structures utilizing a variety of polymers (e.g., polystyrene, PMMA, conducting polymers, etc.) and a single kind of metal nanocrystal, or any combination of different metal nanocrystals. These include, but are not limited to: organically-functionalized Ag nanocrystal single or multilayer films; organically-functionalized Au nanocrystal single or multilayer films; organically-functionalized Pt nanocrystal single or multilayer films; organically-functionalized Pd nanocrystal single or multilayer films; organically-functionalized Au/Co nanocrystal single or multilayer films; any combination therein of the organically-functionalized metal nanocrystals (e.g., a multilayer structure with an Ag/Au/Ag nanocrystal configuration or Ag/Pt/Au nanocrystal configuration, etc.); any variable stoichlometric combination of the organically-functionalized metal nanocrystals (e.g., a 20% Ag/20% Au/10% Pt nanocyrstal/50% polymer configuration).

EXAMPLE 10

(a) dodecylamine-capped Pt nanocrystals were prepared and characterized according to the procedure of Example 7. The particles used here for catalysis had an average domain size of approximately 25 Å; (b) 10 ml of a 10 mg/ml solution of dodecylamine-capped Pt nanocrystals prepared as in (a), above, was combined with 125 ml of clean hexane in a reaction flask. The air was purged from this mixture through three freeze-pump-thaw vacuum cycles over the course of 5 hours; (c) $H_{2(g)}$ was bubbled through the evacuated solution in the reaction flask from (b) for 12 hours; (d) The $H_{2(g)}$ flow was stopped, the initial pressure of $H_{2(g)}$ in the reaction vessel was measured with an in-line mercury manometer (P $H_{2(g)}$=665 torr), and then the flask was completely sealed; (e) 0.5 ml of 1-hexene was injected into the reaction vessel via a 3 cc syringe that had been purged with $H_{2(g)}$; (f) The reaction mixture was vigorously stirred for 5 hours, and the pressure drop of $H_{2(g)}$ was monitored over this time interval. Control experiments (no Pt-catalyst was added) were also carried out in an analogous fashion.

Where no Pt nanocrystals were added, the pressure of $H_{2(g)}$ remains constant at the initial value of 662 torr over the course of 250 minutes. This indicates that no reaction took place (i.e., no conversion of 1-hexene to hexane occurred). Where an aliquot of a hexane solution of dodecylamine-functionalized Pt nanocrystals (avg. diameter ≈25 Å) was initially added, the pressure of $H_{2(g)}$ initially decreases in a logarithmic fashion and then reaches some steady-state value (the conversion of 1-hexene to hexane is presumably complete within about 75 minutes or the catalyst is used up).

Any 10–100 Å Pt and Pd nanocrystals functionalized with amine surface groups that will bind to the particles such as dodecylamine, octadecylamine, or pyridine can be used to produce similar results.

Although the present invention has been described with reference to preferred embodiments, workers skilled in the art will recognize that changes may be made in form and detail without departing from the spirit and scope of the invention.

REFERENCES (1) Bawendi, M. G.; Steigerwald, M. L.; Brus, L. E. *Annu. Rev. Phys. Chem.* 1990, 41, 477.

(2) Henglein, A. *Top. Curr. Chem.* 1988, 143, 113.

(3) Wang, Y.; Herron, N. *Phys. Chem.* 1991, 95, 525.
(4) Hoffman, AlJ.; Mills, G.; Yee, H.; Hoffman, M. R. *J. Phys. Chem.* 1992, 96, 5546.
(5) Colvin, V. L.; Schlamp, M. C.; Alivisatos, A. P. *Nature* 1994, 370, 354.
(6) Heath, J. R.; Gates, S. M.; Chess, C. A. *Appl. Phys. Lett.* 1994, 64, 3569.
(7) Kastner, M. A. *Physics Today* 1993, 46(1), 24.
(8) Hamilton, J. F.; Baetzold, R. C. *Science* 1979, 205, 1213.
(9) Hair, M., Croucher, M. D., Eds. *Colloids and Surfaces in Reprographic Technology;* A.C.S. Symposium Series No. 200; American Chemical Society; Washington, D.C. 1982.
(10) Drake, J. A. G., Ed. *Chemical Technology in Printing and Imaging Systems;* The Royal Society of Chemistry; Cambridge, 1993.
(11) Hayat, M. A., Ed. *Colloidal Gold: Principles, Methods, and Applications, Volume* 1; Academic Press, Inc.: San Diego, Calif., 1989.
(12) Andres, R. P. et al. *Chem. Eng. News* 1992, November 18 (Nanostructured Materials Promise to Advance Range of Technologies).
(13) Leff, D. V.; Ohara, P. C.; Heath, J. R.; Gelbart, W. H. *J. Phy. Chem.* 1995, 99, 7036.
(14) Markowitz, M. A.; Chow, G.; Singh, A. *Langmuir* 1994, 10, 4095.
(15) Meguro, K.; Torizuka, M.; Esumi, K. *Bull Chem. Soc. Jpn.* 1988, 61, 341.
(16) Bonneman, H.; Brijoux, W.; Brinkmann, R.; Dinjs, E.; Joussen, T.; Korall, B. *Angew. Chem. Int. Ed. Engl.* 1991, 30, 1312.
(17) Bonneman, H.; Brijous, W.; Brinkmann, R.; Fretzen, R.; Joussen, T.; Koppler, R.; Korall, B.; Neiteler, P.; Richter, J. *J. Mol. Catal.* 1994, 86, 129.
(18) Brust, M.; Walker, M.; Bethell, D.; Schiffrin, D. J.; Whyman, R. *J. Chem. Soc., Chem. Commun.,* 1994, 802.
(19) Brust, M.; Find, J.; Bethell, D.; Schiffrin, D. J.; Kiely, D. *J. Chem. Soc., Chem. Commun.,* 1995, 1655.
(20) Longenberger, L.; Mills, G. *J. Phys. Chem.* 1995, 99, 475.
(21) Hirai, H.; Yukimichi, N.; Toshima, N. *J Macromol. Sci.-Chem.* 1979, A13(6), 727.
(22) Bahnemann, D. W. *Isr. J. Chem.* 1993, 33, 115.
(23) Henglein, A. Top. Curr. Chem. 1988, 143, 113.
(24) Henglein, A. *Chem. Rev.* 1989, 89, 1861.
(25) Kapoor, K.; Lawless, D.; Kennepohl, P.; Meisel, D.; Serpone, N. *Langmuir* 1994, 10, 3018.
(26) Yeung, S. A.; Hobson, R.; Biggs, S.; Grieser, F. *J. Chem. Soc., Chem. Commun.* 1993, 378.
(27) Nagata, Y.; Watananabe, Y.; Fujita, S.; Dohmnaru, T.; Taniguchi, S. *J. Chem. Soc., Chem. Commun.* 1992, 1621.
(28) Turkevich, J.; Kim, G. *Science* 1970, 169, 873.
(29) Rampino, L. D.; Nord, F. F.; *J. Am. Chem. Soc.* 1941, 63, 2745.
(30) Schmid, G. *Chem. Rev.* 1992, 92, 1709.
(31) Vergaftik, M. N.; Noiseev, I. I.; Kochubey, D. I.; Zanaraev, K. I., *J. Chem. Soc., Faraday Discuss.* 1991, 92, 13.
(33) Schmid, G. Ed. *Clusters and Colloids;* VCH: Weinheim, 1994.
(34) Tanford, C. *The Hydrophobic Effect: Formation of Micelles and Biological Membranes;* John Wiley & Sons, Inc.: New York, N.Y. 1980.

What is claimed is:

1. A method for preparing organically functionalized nanocrystals of metals and metal alloys comprising the steps of:

(a) providing a solution or dispersion of one or more metal salts;

(b) providing a solution of a non-metallic organic surface passivant;

(c) mixing said one or more metal salts with said non-metallic organic surface passivant;

(d) reacting the resulting mixture with a reducing agent to reduce said one or more metal salts to free metal while concomitantly binding said non-metallic organic surface passivant to the resulting free metal surface;

thereby providing organically functionalized metal and metal alloy nanocrystals having a particle diameter of 1–20 nanometers.

2. The method of claim 1 which additionally comprises the steps of providing an organic solution of a phase transfer agent and mixing said phase transfer agent with said one or more metal salts prior to mixing with said non-metallic organic surface passivant.

3. The method of either claim 1 or claim 2 wherein at least one of said metal salts is a transition metal salt.

4. The method of claim 3 wherein said transition metal salt is a salt of Au, Ag, Pt, Pd, Co, or Ni.

5. The method of claim 2 wherein said phase transfer agent is a molecule containing both polar and non-polar functionality.

6. The method of claim 2 wherein said phase transfer agent is a molecule having the ability to form micelles or inverted micelles.

7. The method of claim 2 wherein said phase transfer agent is an amphiphilic molecule.

8. The method of claim 7 wherein said amphiphilic molecule is a member selected from the group consisting of alcohols, ethers, esters, fatty acids, phospholipids, polyphosphate esters, polyethers, alkylammonium salts, tetraalkylboron alkali metal compounds, alkali metal soaps and detergents, and nitrogen-containing aromatic compounds.

9. The method of claim 2 wherein said phase transfer agent is a zwitterion molecule.

10. The method of either claim 1 or claim 2 wherein said non-metallic organic surface passivant is a compound of the formula R-X, wherein R is a member selected from the group consisting of alkyl, aryl, alkynyl, and alkenyl groups, and X is a group which can bind to said free metal surface via strong or weak interactions.

11. The method of either claim 1 or claim 2 wherein said non-metallic organic surface passivant is a member selected from the group consisting of thiols, phosphines, oxyphosphines, disulfides, amines, oxides, and amides.

12. The method of either claim 1 or claim 2 wherein said reducing agent is a member selected from the group consisting of sodium borohydride, sodium cyanoborohydride, sodium citrate, lithium aluminum hydride, K, and NaK.

13. The product of the method of claim 1.

14. The product of the method of claim 2.

* * * * *